United States Patent [19]
Sakurada et al.

[11] Patent Number: 5,817,171
[45] Date of Patent: Oct. 6, 1998

[54] APPARATUS AND METHOD FOR PRODUCING SINGLE CRYSTAL USING CZOCHRALSKI TECHNIQUE

[75] Inventors: Masahiro Sakurada, Kouriyama; Tomohiko Oota, Shirakawa; Kiyotaka Takano; Masanori Kimura, both of Annaka, all of Japan

[73] Assignee: Shin-Etsu Handotai Co., Ltd., Tokyo, Japan

[21] Appl. No.: 655,810

[22] Filed: May 31, 1996

[30] Foreign Application Priority Data

Jun. 9, 1995 [JP] Japan ................................. 7-143586

[51] Int. Cl.$^6$ .................................................. C30B 15/14
[52] U.S. Cl. ............................ 117/13; 117/200; 117/217; 117/222; 432/248
[58] Field of Search ............................ 432/248; 437/250, 437/251; 117/200, 208, 215, 216, 217, 222, 900, 13, 15

[56] References Cited

U.S. PATENT DOCUMENTS

| | | |
|---|---|---|
| 4,613,486 | 9/1986 | Tatsumi et al. .................. 117/217 |
| 5,098,675 | 3/1992 | Matsuo et al. ................... 117/217 |
| 5,363,796 | 11/1994 | Kabayashi et al. .............. 117/217 |

FOREIGN PATENT DOCUMENTS

| | | |
|---|---|---|
| 0140509 | 5/1985 | European Pat. Off. . |
| 0355833 | 2/1990 | European Pat. Off. . |
| 2218789 | 11/1989 | United Kingdom . |

OTHER PUBLICATIONS

H. Yamagishi et al. *Semiconductor Silicon*, (1994), "Evaluation of FFDS and Cops in Silicon Single–Crystals", pp. 124–135.

*Primary Examiner*—Felisa Garrett
*Attorney, Agent, or Firm*—Oliff & Berridge, PLC

[57] ABSTRACT

A puller and method for crystal growth using the Czochralski technique in which a temperature profile and a history of thermal conditions of a growing crystal is controllable with ease and a good accuracy, which puller comprises a crucible containing raw material, heater for melting by heating the raw material and a heat insulating cylinder surrounding them, the heat insulating cylinder being cross-sectionally divided by an annular separation gap or gaps into parts and which method is applicable to growth of such a single crystal as of silicon, germanium, GaP, GaAs or InP in the puller. Methods for controlling a temperature profile and a history of thermal conditions of a growing crystal using the czochralski technique in the puller.

16 Claims, 3 Drawing Sheets

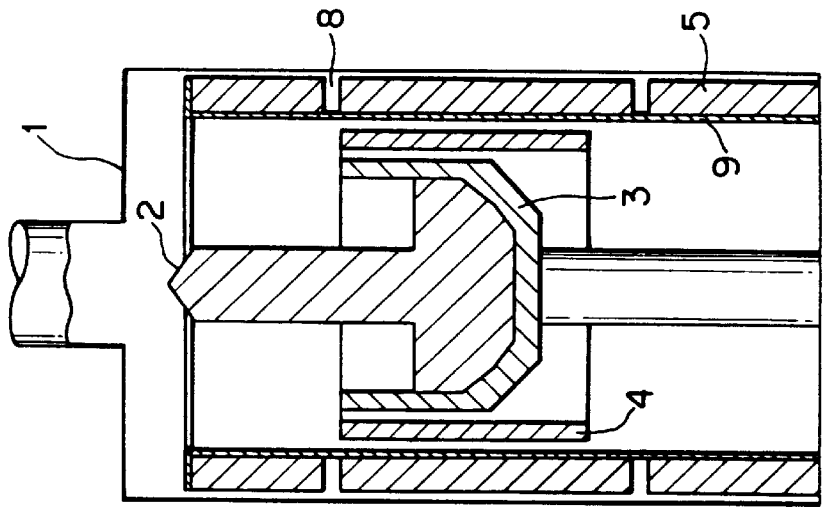
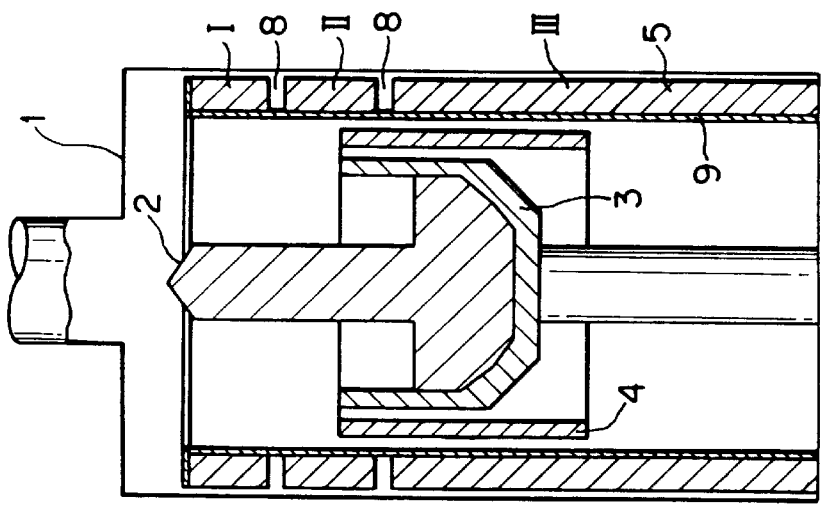
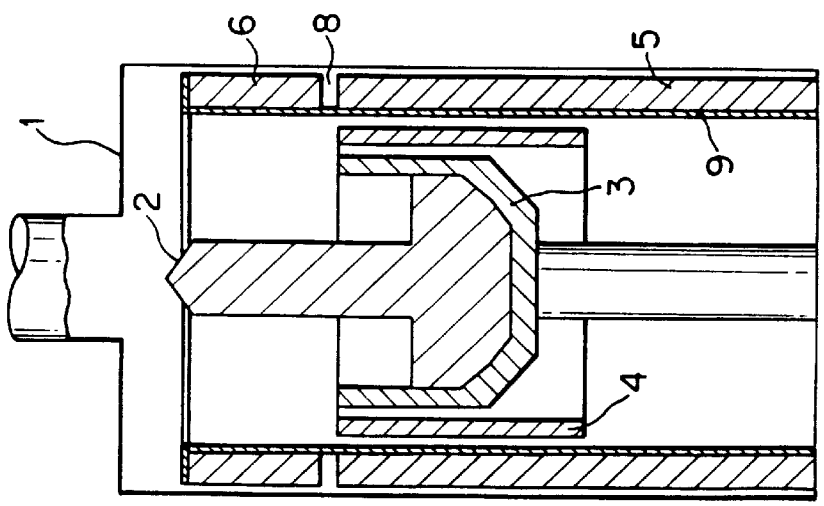

APPARATUS AND METHOD FOR PRODUCING SINGLE CRYSTAL USING CZOCHRALSKI TECHNIQUE

BACKGROUND OF THE INVENTION

1. Field of the Invention

The present invention relates to an apparatus and method for producing a single crystal using the Czochralski technique.

2. Related Prior Art

Recently requirement for the quality of a semiconductor crystal substrate has increasingly become severer keeping pace with the trend of progressive increase in scale and precision of integration in a semiconductor device. Semiconductor crystals are mainly produced using the Czochralski technique or pulling technique and efforts on purification, a lower defect density and higher quality-wise homogenenity thereof have been continued. More recently, it has been found that not only purification of raw materials and parts used in a puller and improvement of the mechanical precision of the puller but also a history of thermal conditions during growth (heretofore also simply referred to as a thermal history) give an great influence on generation of defects in the bulk of a crystal. For instance, in the case of a silicon single crystal, it has been established that OSF (a short for Oxidation Induced Stacking Fault), oxygen precipitation, BMD (a short for Bulk Micro-Defect), FPD (a short for Flow Pattern Defect), LSTD (a short for Laser Scattering Tomography Defect), dielectric breakdown strength in oxides and the like are affected by a thermal history during growth. Besides, it has been made clear that, in the cases of such compound semiconductors as GaP, GaAs, InP and the like too, a dislocation density and defect levels acting as a donor or acceptor receive an influence of a thermal history during growth. In light of such accumulated knowledge, various pullers having different internal structures have been proposed for controlling of crystal defects through adjustment of a thermal history, one of which pullers is disclosed, for example, in an article of H. Yamagishi, I. Fusegawa, K. Takano, E. Iino, N. Fujimaki, T. Ohta and M. Sakurada: Proceedings of the 17th international symposium on Silicon Materials Science and Technology, SEMICONDUCTOR SILICON 1994, p 124~135.

However, these apparatuses and methods for operating the same are only capable of raise or lower a temperature at a special position of an internal part in a puller, but not capable of adjustment of a whole temperature profile in the puller. Controlling a temperature at a special position of the internal part can be realized only through totally changing temperatures on a growing crystal with almost no freedom for profile adjustment and besides the precision of the controlling is poor. What's more, it is very difficult for them to control a special temperature range only. When a new temperature profile is required for the purpose to effect a task, each of these apparatus has to be basically changed in the design of the whole structure, which means that there is a disadvantage that each has to be newly designed into a fundamentally different apparatus.

SUMMARY OF THE INVENTION

In light of the above problems which the conventional technology had, the present invention was made to solve them. It is an object of the present invention to provide an apparatus and method for producing a crystal using the Czochralski technique that is capable of controlling a history of thermal conditions of a growing crystal during growth with not only ease but also good precision.

The inventors completed the present invention giving a special attention to a structure of a heat insulating hollow cylinder 5 surrounding a crucible 3 and a heater 4 in the Czochralski technique. The present invention is directed to an apparatus using the Czochralski technique comprising a crucible 3 containing a raw material therein, a heater 4 for melting the raw material and a heat insulating cylinder 5 surrounding the two, wherein the heat insulating cylinder 5 further has an annular separation gap 8 in the vertically mid portion which gap 8 physically and thereby thermally divides the cylinder 5 into the upper 6 and lower portions, a plurality of separation gaps 8 are, one above another, included in an heat insulating cylinder 5 an annular separation gap 8 is located above the melt surface, the heat insulating cylinder 5 is a carbon fiber form and the upper 6 and lower portions can be individually selected in terms of thickness or structural material. The present invention is also directed to a crystal 2, of any of the group consisting of silicon, germanium, GaP, GaAs and InP, produced by means of the above-mentioned apparatus.

The present invention is further directed to the following methods which are: a first method in which a crystal 2 of any of the group consisting of silicon, germanium, GaP, GaAs and InP with the above-mentioned apparatus, a second method in which a temperature profile in a puller for growing a crystal 2 using the Czochralski technique is controlled and a third method in which a history of thermal conditions of a growing crystal 2 is controlled during growth in the Czochralski technique.

The present invention is below described in more detail. The structure of a heat insulating cylinder 5 attracted an attention of the inventors as a means for modifying or adjusting a history of thermal conditions of a growing crystal 2 by means of the Czochralski technique, said heat insulating cylinder 5 surrounding and thermally insulating a crucible containing raw material, a heater 4 for melting by heating the raw material and the like. A puller for growing a crystal 2 according to a traditional Czochralski technique is shown in FIG. 1(a). In the puller, a heat insulating cylinder 5 is arranged in such a manner that it surrounds a crucible 3 containing raw material and a heater 4 for melting by heating the raw material and generally is a carbon fiber form.

In the past, in order to adjust a thermal history in which a growing crystal 2 is affected or a temperature profile inside a puller by modifying a structure of the heat insulating cylinder 5, modifications were adopted that the heat insulating cylinder 5 was extended upwardly in order to thermally insulate the upper space 7 of the puller as illustrated in FIG. 1(b) and in turn thermally insulate a growing crystal 2, or, to the contrary, the heat insulating cylinder 5 was shortened to rapidly cool a growing crystal 2. In these methods, since all that can be done were whether to thermally insulate a growing crystal 2 or to cool it, it was impossible to adjust a thermal history or temperature profile in a special temperature range only and what's worse the adjustment was not accurate if it was attained in any degree. These methods were not recommendable concerning other points. That is, since the heat insulating cylinder 5 was simply extended upwardly and therefore a growing crystal 2 was thermally insulated with a difficulty of cooling, a growth rate of the crystal 2 was lowered to greatly decrease the productivity. And on the other hand if the heat insulating cylinder 5 was simply shortened, a degree of insulation was degraded not only to increase the power consumption and to give a damage to the puller but also to lower the productivity of the puller. In consideration of the above faults in the traditional technology, a variety of measures were tried to cope with them: For example, other parts than a heat insulating cylinder 5 were proposed and pullers having different kinds of inner structure were designed in order to modify a history of thermal conditions of a growing crystal 2, as disclosed in the above-mentioned article reported by H. Yamagishi et al.

To sum up, in the past, since a small latitude of freedom was allowed to adjustment of a thermal history of a growing crystal 2 in modification of a structure of the heat insulating cylinder 5, one has not regarded the modification of the structure as an object of research and the extension or contraction of the heat insulating cylinder 5 was at most tried for the purpose.

The inventors, however, gave a serious consideration on a better structure of the heat insulating cylinder 5 to achieve the objects of the present invention under understandings that it is a heat insulating cylinder 5 that gives a decisive influence on a temperature profile in the chamber 1 of a puller in the Czochralski technique, wherein said heat insulating cylinder 5 surrounds a heater 4, for example a carbon heater, a high-frequency coil or the like, and a crucible 3, for example such as made of quartz, graphite or PBN, and protects a water-cooled chamber 1 of a puller.

In the course of research to the present invention, various results of experiments were not only accumulated but considered by the inventors. For example, if one intends a modification in a thermal history of a growing crystal 2, which modification is to insulate a temperature range, in a puller having a traditional internal structure (FIG. 1(a)), the heat insulating cylinder 5 will be simply extended upwardly to thermally insulate the growing crystal 2. In such a modification, since the whole temperature range of the growing crystal 2 is totally insulated thermally, an intended pattern of the thermal history cannot be realized, in which pattern only a designated temperature range is thermally insulated, and lowering a growth rate and thereby tremendous decrease in the productivity of crystals 2 occur. In order to produce quality crystals 2 having fewer defects with a high growth rate and high productivity, therefore, all that has to be done are to modify a thermal history of a growing crystal 2 by thermally insulating a special temperature range only, thereby to decrease the number of crystal defects and besides to control a high temperature range in the vicinity of the melting point of the crystal not to be affected by the modification of the thermal history, said high temperature range giving an influence on the crystal growth rate.

In light of these understandings and knowledges discussed above, the inventors first estimated, by means of numerical calculation, temperatures in a growing crystal 2 in each of pullers respectively having a variety of internal structures. Findings are that first it is possible to gradually cool a growing crystal 2 only in a special range below the melting point of the crystal, since the radiation loss from a surface of the growing crystal 2 decreases when a heat insulating cylinder 5 which surrounds a heater 4 is upwardly extended as shown in FIG. 2(a) in contrast with a heat insulating cylinder 5 as shown in FIG. 1(a), which is traditional and second it is possible to maintain the high temperature range as it was or even modify it into a condition of more rapid cooling by dividing the heat insulating cylinder 5 into the two parts of an upper portion 6 and lower portion with provision of an annular separation gap 8. In other words, according to the findings, it is possible to modify a special temperature range only to gradually cool a growing crystal, to attain decrease in crystal defects and in addition to maintain the same growth rate with the same productivity as before since the other temperature ranges, especially the high temperature range, which affects a crystal growth rate, is not affected essentially in any ways.

This is why a region of a growing crystal 2 corresponding to the presence of a heat insulating cylinder mass are thermally insulated, but radiation loss from the surface of a region corresponding to an annular separation gap 8 increases. Therefore, positions, widths and numbers of separation gaps 8 are important and can be properly chosen in dependence on a temperature range for adjustment. For example, two positions or more for separation gaps 8 may be chosen, as shown in FIG. 2(b). A separation gap 8 in a heat insulating cylinder 5 is effectively located above the melt surface of raw material in a crucible 3 in order to control a history of thermal conditions of a growing crystal 2 in the Czochralski technique, since the separation gap 8 acts more directly on the growing crystal 2 above the melt surface, when control of a history of thermal conditions of the growing crystal 2 in the Czochralski technique is desired by providing the separation gap 8 in the heat insulating cylinder 5, which is vertically divided into two parts by the separation gap 8. However, it is not that only one separation gap 8 is provided, and a position of the separation gap 8 is limited to one above the melt surface, but positions, numbers and widths of separation gaps 8 can be chosen in order to modify and control a temperature profile in a puller chamber 1, said temperature profile affecting an efficiency in crystal production, and to attain a better efficiency in crystal production, as shown, for example, in FIG. 2(c)).

In the past, the heat insulating cylinder 5 was a carbon fiber form. A structural material may be the same as in the past or another heat-insulating material. Heretofore, in some case, the heat insulating cylinder 5 was constructed in a body, made of a single kind of material and vertically same in thickness or in other case, such a heat insulating cylinder 5 was an assembly of parts of the same material, same lateral dimensions and same thickness vertically stacked one on another each of which parts is in the shape of a smaller cylinder both ends of which are horizontal planes. According to the present invention, a heat insulating cylinder 5 is internally divided into cylindrical parts along the height with a separation gap or separation gaps 8, but still remains in a body, and not only kinds of structural materials but also thicknesses of the cylindrical parts can be different from each other such that finer control on a temperature profile and a thermal history of a growing crystal 2. That is, in reference to FIG. 2(b), a heat insulating cylinder 5 according the present invention is divided into three cylindrical parts I, II and III with two separation gaps 8 lying therebetween. A temperature profile in the chamber 1 of a puller or a thermal history of crystal is greatly affected by the positions, widths of the gap openings and number of separation gaps 8, while a temperature profile and a thermal history also can be finely adjusted by individually modifying thicknesses and changing structural materials of the three parts of the heat insulating cylinder 5.

It is simple and easy to machine a carbon fiber form to an assembled heat insulating cylinder 5 with separation gaps 8 at desired positions in the assembly. In general, since the heat insulating cylinder 5 is made of a fibrous material and has a risk to disperse fractures of a fiber from its own into a crucible 3 in the chamber 1, a graphite inner cylinder 9 is fittingly inserted inside the hollow heat insulating cylinder 5. The structure as shown in FIG. 2(a) can be obtained, for example, by fittingly slip cylindrical parts of the heat insulating cylinder 5 upwardly or downwardly on the outer surface of the graphite inner cylinder 9 which has been machined to have a small annular projection on the outer surface at a desired height.

The recess of a separation gap 8 may be left open as they were or intentionally filled with a thermally-good conductor, such as graphite or the like.

It is needless to say that a puller for crystal growth comprising a heat insulating cylinder 5 according to the present invention, method of producing a single crystal 2 using the same and methods of controlling a temperature profile and thermal history in the chamber 1 of the puller according to the present invention are all useful for various kinds of crystal grown generally by means of the Chochralski technique. The present invention are especially effective for the production of a silicon crystal in the bulk of which OSF or Oxidation Induced Stacking Faults, oxygen precipitation, BMD or Bulk Micro-Defect, FPD or Flow Pattern Defect, LSTD or Laser Scattering Tomography Defect, dielectric breakdown strength in oxides and the like are greatly affected by the thermal history of a growing crystal 2, or for the production of compound semiconductors such as GaP, GaAs, InP and the like in the bulk of which a dislocation density and a defect level functioning as a donor or acceptor are also greatly affected by the thermal history of a growing crystal 2.

In the present invention, since a heat insulating cylinder 5 surrounding a crucible 3, heater 4 and the like which are used in the Czochralski technique is cross-sectionally divided at a height into parts 6 with a annular separation gap 8 between the parts, radiation loss can be locally increased from a surface of a growing crystal 2 opposite to the gap 8. And further since the number, widths of the openings and heights of separation gaps 8 are chosen in a various ways with ease, a thermal history of a growing crystal 2 and a temperature profile in the chamber 1 of a puller also can be controllably modified with ease and accuracy in dependence on purposes. Besides, if a structural material and thickness of each part of the heat insulating cylinder 5 is individually changed for adjustment, a thermal history and temperature profile can be controlled in a more accurate manner, since degrees of thermal insulation or heat dissipation by radiation can be more finely adjusted.

BRIEF DESCRIPTION OF THE DRAWINGS

The novel features which are considered characteristic of the present invention are set forth with particularity in the appended claims. The present invention itself, however, and additional objects and advantages thereof will best be understood from the following description of embodiments thereof when read in connection with the accompanying drawings, in which:

FIG. 2(a) is a schematic, sectional view of a puller for crystal growth with an annular separation gap 8 according to the present invention, FIG. 2(b) is a schematic, sectional view of a puller for crystal growth with two annular separation gaps 8 according to the present invention, FIG. 2(c) is a schematic, sectional view of a puller for crystal growth with two annular separation gaps 8 according to the present invention, wherein the vertical positions of the gaps 8 are different from those in FIG. 2 (b)

DETAILED DESCRIPTION OF THE INVENTION

Below, description will be given about examples according to the present invention and a comparative example.

Figure 1A:
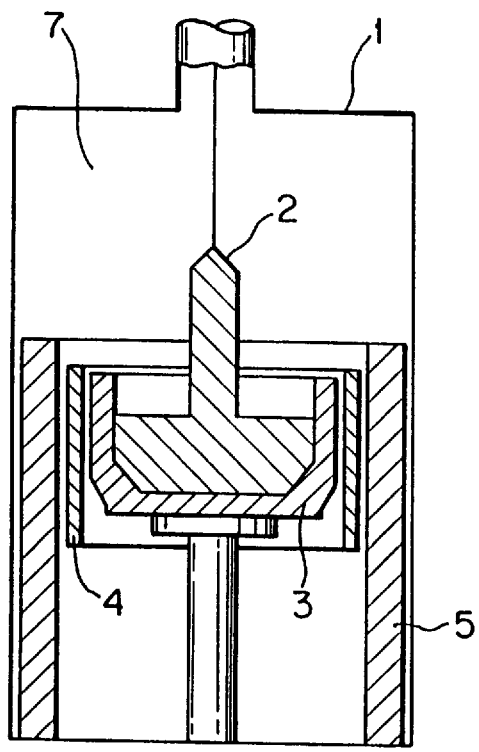
FIG. 1(a) is a schematic, sectional view of a traditional puller, which is of a rapid-cooling type, for crystal growth using the Czochralski technique.
Figure 1B:
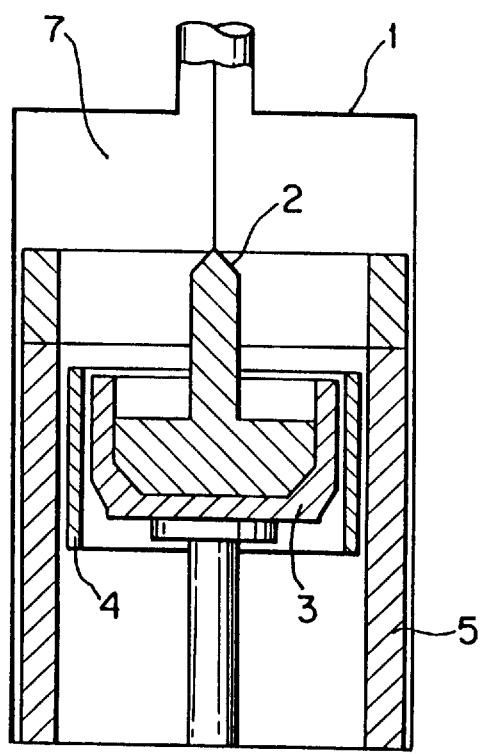
FIG. 1(b) is a schematic, sectional view of another traditional puller, which is of a gradual-cooling type, for crystal growth using the Czochralski technique.
Figure 3:
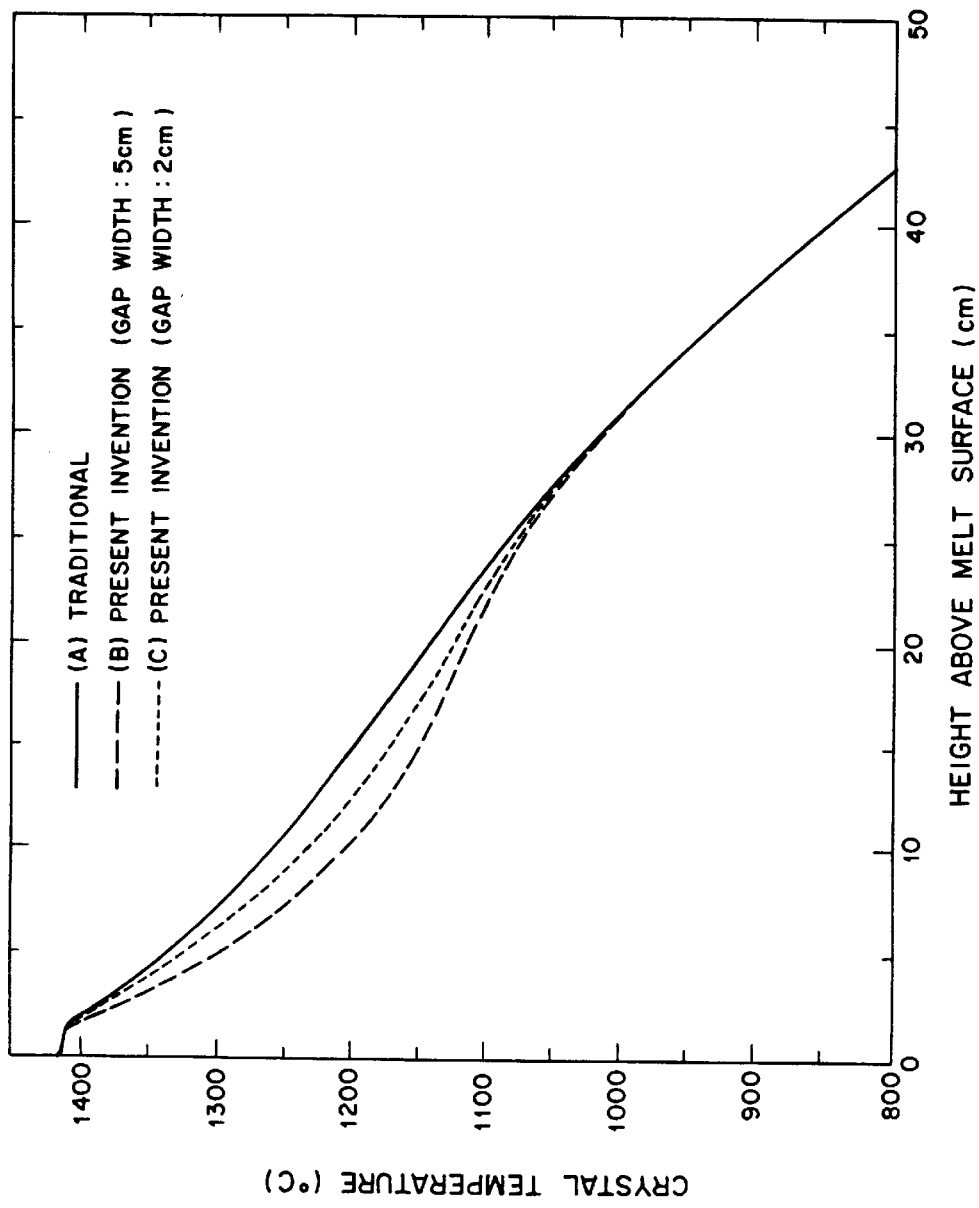
FIG. 3 is a graph showing measurement of thermal histories of growing crystals 2 in pullers with respectively different structures of heat insulating cylinders 5 therein.

Crystals 2 having a diameter of 6 inches and a growth direction of <100> were respectively grown in pullers with heat insulating cylinders 5 having different structures by means of the Czochralski technique, wherein 50 kg of polycrystal silicon as a raw material was charged in a quartz crucible 3 of 18 inches in diameter, one of the structures is of a traditional type and the other is of a type according to the present invention. Thermal histories of the growing crystals 2 were measured. Heaters 4 used in the chambers 1 of the pullers were made of carbon, which means that they were resistance heaters. In the comparative example, a heat insulating cylinder 5 as shown in FIG. 1(b) was used as the traditional heat insulating cylinder 5 and the heat insulating cylinder 5 was a carbon fiber form having a constant thickness of 7 cm along the height. The measurement of the thermal history is shown as a curve A in FIG. 3.

In a first example, crystal growth was conducted in the same way as in the comparative example, with an exception that the heat insulating cylinder 5 had an annular separation gap 8 with a width of the opening of 5 cm located at the position of 14 cm high. A silicon single crystal 2 was grown in a puller having the heat insulating cylinder 5 of a kind as shown in FIG. 2(a). The measurement of the thermal history is shown as a curve B in FIG. 3.

In the first example, it can be seen that the growing crystal 2 was rapidly cooled in a high temperature range in the vicinity of the melting point of about 1,420° C. but gradually cooled in a medium temperature range which spanned generally from 1,050° C. to 1,200° C. In other words, a combination of a rapid cooling type of thermal history in a high temperature range and a gradual cooling type of thermal history in a medium temperature range was realized. On the other hand, in a range of temperatures of 1,050° C. and lower both the comparative example and the first example showed essentially the same thermal history. To sum up, in the first example the thermal history was partly modified from that in the comparative example in a special temperature range only. From the findings in the first example, it can be said that a crystal growth with a rate as high as about 1.2 mm/min. has become possible in contrast with the fact that a traditional growth rate was generally at about 1 mm/min. It was successfully achieved to change a thermal history in a medium temperature range to a type of gradual cooling with no reduction of productivity in crystal growth.

In a third example, a crystal 2 was grown in the same way as in the first example with an exception that the width of a separation gap 8 of the heat insulating cylinder 5 is 2 cm, which is smaller than that in the first example. Measurement of a thermal history in the second example is shown as a curve C in FIG. 3. It can be seen from comparison of the curves in regard to relative positioning in FIG. 3 that the curve C is present in the middle between the curves A and B and a fine control of a thermal history is practically possible.

What is claimed is:

1. A puller for growing a crystal by the Czochralski technique from molten material having a melt surface comprising:

a crucible for containing the molten material, a heater for heating the molten material and at least two substantially coaxial heat insulating cylinders, wherein axes of the at least two heat insulating cylinders pass inside the crucible and the heater; and an annular separation gap, which separates two of the at least two heat insulating cylinders, is located above the melt surface.

2. A puller according to claim 1, wherein the at least two heat insulating cylinders consist of at least three heat insulating cylinders, and a plurality of annular separation gaps is provided between the at least three heat insulating cylinders.

3. A puller according to claim 2, wherein the at least three heat insulating cylinders comprise carbon fiber.

4. A puller according to claim 2, wherein the at least three heat insulating cylinders each have a different thickness.

5. A puller according to claim 2, wherein a first cylinder of the at least three heat insulating cylinders comprises carbon fiber and a second cylinder of the at least three heat insulating cylinders consists of a heat insulating material different than carbon fiber.

6. A puller according to claim 2, used to grow a crystal of silicon, germanium, GaP, GaAs, or InP.

7. A puller according to claim 1, wherein the at least two heat insulating cylinders comprise carbon fiber.

8. A puller according to claim 1, wherein the at least two heat insulating cylinders each have a different thickness.

9. A puller according to claim 1, wherein a first cylinder of the at least two heat insulating cylinders comprises carbon fiber and a second cylinder of the at least two heat insulating cylinders consists of a heat insulating material different than carbon fiber.

10. A puller according to claim 1, used to grow a crystal of silicon, germanium, GaP, GaAs, or InP.

11. A method of producing a single crystal using a puller for growing a crystal by the Czochralski technique from molten material having a melt surface, the method comprising:

introducing raw material into the puller, wherein the puller comprises a crucible for containing the molten material, a heater for heating the molten material and at least two substantially coaxial heat insulating cylinders;

axes of the at least two heat insulating cylinders pass inside the crucible and the heater;

an annular separation gap, which separates two of the at least two heat insulating cylinders, is located above the melt surface; and the raw material is introduced into the crucible, heating the raw material to form the molten material, and pulling the crystal from the molten material.

12. A method according to claim 11, further comprising controlling a temperature profile within the puller.

13. A method according to claim 12, wherein the step of controlling a temperature profile comprises locating the annular separation gap above the melt surface.

14. A method according to claim 11, further comprising controlling a thermal history of the crystal.

15. A method according to claim 14, wherein the step of controlling a thermal history of the crystal comprises locating the annular separation gap above the melt surface.

16. A method according to claim 11, wherein the raw material is selected from the group consisting of silicon, germanium, GaP, GaAs and InP.

* * * * *

UNITED STATES PATENT AND TRADEMARK OFFICE
CERTIFICATE OF CORRECTION

PATENT NO. : 5,817,171
DATED : October 6, 1998
INVENTOR(S) : Masahiro SAKURADA et al.

It is certified that error appears in the above-indentified patent and that said Letters Patent is hereby corrected as shown below:

On the cover page, at "[75] Inventors:" change the second inventor's name "Tomohiko Oota" to --Tomohiko Ohta--.

Signed and Sealed this

Fifth Day of January, 1999

*Attest:*

*Attesting Officer*  *Acting Commissioner of Patents and Trademarks*